United States Patent [19]
Nishihata

[11] Patent Number: 5,801,400
[45] Date of Patent: Sep. 1, 1998

[54] ACTIVE MATRIX DEVICE

[75] Inventor: Toshihiko Nishihata, Yokohama, Japan

[73] Assignee: Victor Company of Japan, Ltd., Yokohama, Japan

[21] Appl. No.: 585,427

[22] Filed: Jan. 11, 1996

[30] Foreign Application Priority Data

Jan. 10, 1995 [JP] Japan .................................. 7-018426

[51] Int. Cl.$^6$ .................................................. H01L 27/14
[52] U.S. Cl. .................. 257/72; 257/59; 257/290; 257/291; 257/431; 257/436; 257/444
[58] Field of Search ...................... 257/59, 72, 88, 257/289, 290, 291, 431, 436, 444, 447, 78

[56] References Cited

U.S. PATENT DOCUMENTS

| | | | |
|---|---|---|---|
| 5,245,452 | 9/1993 | Nakamura et al. | 257/444 |
| 5,317,174 | 5/1994 | Hynecek | 257/72 |

FOREIGN PATENT DOCUMENTS

| | | | |
|---|---|---|---|
| 55-12919 | 1/1980 | Japan . | |
| 57-20778 | 2/1982 | Japan . | |
| 57-27065 | 2/1982 | Japan . | |
| 60-66470 | 4/1985 | Japan . | |
| 2-000922 | 1/1990 | Japan . | |
| 3-135597 | 6/1991 | Japan . | |
| 3-288474 | 12/1991 | Japan . | |
| 5-241199 | 8/1993 | Japan . | |
| 6-273592 | 10/1993 | Japan . | |
| 6-274922 | 2/1994 | Japan . | |

*Primary Examiner*—Carl W. Whitehead, Jr.
*Attorney, Agent, or Firm*—Jacobson, Price, Holman & Stern, PLLC

[57] ABSTRACT

An active matrix device has switching transistors arranged into a matrix pattern on a semiconductor substrate of a first conductivity type. Data is supplied, via signal lines, to sources of the transistors. Turn-on and -off operation of the of the transistors are controlled via gate lines. Pixel electrodes are connected to drains of the transistors. The active matrix device also has semiconductor regions of a second conductivity type opposite to the first conductivity type. The semiconductor regions are formed on the semiconductor substrate so that the semiconductor regions are separated from each other by portions of the semiconductor substrate. The transistors are formed in the semiconductor regions. The semiconductor substrate and the semiconductor regions are reverse-biased with respect to each other.

5 Claims, 17 Drawing Sheets

… ,….,...

ACTIVE MATRIX DEVICE

BACKGROUND OF THE INVENTION

1. Field of the Invention

The present invention relates to a semiconductor device, and more specifically to a semiconductor active matrix device irradiated with light in operation, such as an active matrix device for driving a liquid crystal display unit, for instance.

In a reflective type active matrix device using a silicon (Si) substrate, for instance to drive a liquid crystal display unit, it is necessary to irradiate the matrix device with intense incident light in order to obtain bright display. In this case, however, when part of the incident light enters the Si substrate, since photo-carriers are generated, the generated carriers exert a harmful influence upon the matrix device operation.

2. Description of the Prior Art

FIG. 1 is a circuit diagram showing a conventional reflective type active matrix device used for liquid crystal display unit, and FIG. 2 is a partial perspective view showing the same device.

In these drawings, switching pixel transistors 1 are arranged into a matrix pattern on a Si substrate 13. These switching pixel transistors are selectively driven by a horizontal address circuit 2 and a vertical address circuit 3. Signal lines 5 are connected to sources 4 of the pixel transistors 1; scanning lines 7 are connected to their gates 6; and pixel electrodes 9 are connected to their drains 8.

Whenever select signals are applied to the scanning lines 7, addressed transistors are turned on so that data are written in the pixel electrodes 9 of the turned-on transistors through the signal lines 5.

As shown in FIG. 2, on the side opposite to the pixel electrodes 9 relative to liquid crystals 10, an electrode 11 is provided in such a way that it covers all the pixel electrodes 9. The liquid crystals 10 form capacitance C1 (referred to as liquid crystal capacitor C1, hereinafter) between the pixel electrodes 9 and the electrode 11.

Further, a transparent substrate 12 is placed on the electrode 11. The written data are stored in the liquid crystal capacitors C1 as charges, and kept stored until rewritten in the succeeding field. In usual, an auxiliary capacitor (additive capacitor) C2 is provided in parallel to each liquid crystal capacitor C1, in order to lengthen the storage time of the data (i.e., charges).

A problem involved in the conventional active matrix device due to the presence of photo-carriers will be described hereinbelow.

FIG. 3 is a cross-sectional view of a pixel portion of the reflective type active matrix device of FIG. 1.

A pixel transistor with the source 4, the gate 6, the drain 8, and a gate oxide film 17 is formed on the Si substrate 13. As already explained, the electrode 11 is formed so as to cover all over the pixel electrodes 9. And the liquid crystal 10 is interposed between the pixel electrodes 9 and the electrode 11. Further, the substrate 12 is formed on the electrode 11. Whenever light is allowed to be incident upon the substrate 12, the incident light is reflected from the surfaces of the pixel electrodes 9. And the reflected light is modulated by the liquid crystal 10 for display.

Here, a reflective type active matrix device having N-channel pixel transistors 1 formed on a P-type Si substrate 13 will be discussed. That is, the sources 4, and the drains 8 of the transistors are of N-type semiconductor, and the P-type Si substrate 13 is held at a grounded potential. In contrast with this, the pixel electrodes 9 are held at a plus potential by writing data in the pixel transistors. The plus potential depends on the voltage-dependence characteristics of the liquid crystal 10, the potential of the electrode 11, and the video data. The drains of the pixel transistors 1 are of N-type diffusion layer, so that a PN junction is formed between each drain and the P-type Si substrate. Since the pixel electrodes 9 are held at the plus potential, the PN junction is reverse-biased. As a result, if leak current flows through the PN junction, there exists a problem in that the data holding characteristics deteriorate.

It is preferable that the incident light is reflected perfectly (100%) from the reflective surfaces of the pixel electrodes 9. In practice, however, a beam of light 14 enters the inner portion of the Si substrate 13 through a gap 15 between the two adjacent pixel electrodes 9 or through the pixel electrode 9.

As a result, a great number of photo-carriers (i.e., pairs of electrons 15A and holes 16B) are generated. Here, since the generated holes 16B have a positive charge, they reach the ground terminal through the P-type Si substrate 13 held at the ground potential, no problem arises.

In contrast with this, since the generated electrons 15A have a negative charge, they reach the drain 8 held at the positive potential. The positive potential held at each of the drain regions 8 thus drops, so that it is impossible to keep an appropriate pixel potential at the drain region 8. Here, the practical numerical value can be estimated as follows: The assumption is made that R (%) of the incident light of an intensity P (W/cm$^2$) enters the Si substrate 13. And the entered light generates photo-carriers at a quantum efficiency of 100%. In this case, electrons as expressed by the following formula are to be generated per field (⅟₆₀ sec) within a range of pixel electrode size of X (cm) ×X (cm):

$$N = P \cdot X^2 \times \tfrac{1}{60} \times R/100 \times r/(hc)$$

where N denotes the number of the generated electrons; r denotes the wavelength (cm) of the incident light; h denotes the Plank's constant (6.63×10$^{-34}$ j·s); and c denotes the luminous velocity (3×10$^{10}$ cm/s).

Here, when the relative dielectric constant of the liquid crystal 10 is denoted by d, and its thickness is denoted by L(cm), the capacitance C of the liquid crystal capacitor C1 per pixel can be expressed as $$C(F) = S \times d \times (X^2/L)$$

where s denotes the dielectric constant of vacuum (8.85 e$^{-14}$ F/cm).

Consequently, when N numbers of electrons enter the drain 9, the potential dV of the pixel electrode 9 drops by a value as expressed as $$dV(V) = (N \times q)/C = (1.51 \times 10^{13}) \times (P \cdot R) \times r \times (L/d)$$

where q denotes a charge of electron (1.6 e$^{-19}$ C).

An example of operating conditions of a conventional reflective type liquid crystal projector is as follows:
(Set conditions)
Incident light intensity per unit area (P): 10 W/cm$^2$ Transmissivity (R): 0.001% (⅟₁₀$^5$) Wavelength (r): 5000×10$^{-8}$ cm (=500 nm) Liquid crystal thickness (L): 5×10$^{-4}$ cm (=5μ) Liquid crystal dielectric constant (d):10

When the above-mentioned set conditions are used for the above-mentioned formula, dV=75.6 V can be obtained. In the practical active matrix device, since an auxiliary capacitor C2 about 10 times larger than the liquid crystal capacitor C1 is provided in parallel as shown in FIG. 1, in this case dV can be reduced down to 1/10(7.8 V).

The above-mentioned results indicate that even if part of incident light enters the Si substrate 13 at a small rate (e.g., 1/100,000), the pixel potential of as high as several volts is shifted.

To overcome the above-mentioned problem caused by photo-carriers, the following countermeasures have been so far considered:

(1) to provide a dielectric reflective film on the surface of a semiconductor substrate to reflect incident light;

(2) to provide a light absorbing layer on the surface of a semiconductor substrate for absorbing incident light;

(3) to extinguish photo-carriers generated in a semiconductor substrate; and (4) to fabricate a semiconductor substrate with upper and lower layers of opposite conductivity-types for absorbing generated photo-carriers in the lower layer.

The countermeasure (1) is disclosed in Japanese Patent No. 4(1992)-051070, for instance. This example provides a multi-layer reflective film with lamination of non-crystal Si layers and insulating layers for preventing incident light from entering a semiconductor layer. This example uses a dielectric substance so that an unnecessary parasitic capacitance is not generated.

The countermeasure (2) is disclosed in Japanese Patent Laid-Open No. 5(1993)-241199, for instance. This example provides a light absorbing layer of titanium with low-reflection factor laminated on the surface of signal lines to decrease irregular reflection light for prevention of light from entering a semiconductor layer. Further, as another example, there exists Japanese Patent No. 61(1986)43712, for instance. This example provides a light shielding layer of metallic film formed under pixel electrodes.

The countermeasure (3) is disclosed in Japanese Patent No. 4(1992)-34313, for instance. In this example, the semiconductor regions other than the regions at which transistors are formed are doped at a high concentration to shorten the life time of carriers. That is, even if photo-carriers are generated, the generated photo-carriers can be extinguished by recombination before reaching the transistors.

Further, the countermeasure (4) is disclosed in Japanese Patent Laid-Open No. 3(1991)-288474, for instance. This example provides a well structure of a semiconductor substrate with upper and lower layers of opposite conductivity-types to absorb generated photo-carriers in the lower layer.

However, the example disclosing the countermeasure (1) involves the following problems:

(A) Since the film thickness and the refraction factor (refractive index) of each film constituting the multilayer reflective film must be controlled accurately, there exists a problem in that the manufacturing yield is relatively low and the manufacturing cost is relatively high.

(B) In principle, the light reflected at 100% is only the light having a specific wavelength decided by the film thickness and the refraction factor. Therefore, in the case of color liquid crystal display device, it is necessary to adjust the film thickness and the refraction factor for each color.

(C) In case that the angle of incidence disperses, the reflection factor inevitably decreases.

(D) Provision of a dielectric film formed on pixel electrodes induces potential drops at the dielectric film. This requires a high driving voltage.

The example disclosing the countermeasure (2) involves the following problems:

(A) A semiconductor film or a high-melting point metallic film is used as the light absorbing layer. In the case of the semiconductor film, the film must be thick enough to shade light, and thereby a long process time is required to form the film. On the other hand, in the case of the metallic film, a high temperature processing is required to form the high-melting point metallic film, and thereby the heat generated during the manufacturing process exerts a harmful influence (e.g., film stress) upon the formed metallic film.

(B) In operation, heat is generated by absorbing light, so that the device operation is susceptible to harmful influence.

The example disclosing the countermeasure (3) involves the following problems:

A relatively complicated manufacturing process (e.g., epitaxial process) is required, and thereby there exists a problem in that the device yield is relatively low and therefore the cost is relatively high.

Further, there exists a common problem in the examples disclosing the countermeasures (1) to (3). The problem is that the respective specific process must be added in order to fabricate the respective structure, and thereby the device yield is relatively low and therefore the cost is relatively high.

The example disclosing the countermeasure (4) will be explained in detail with reference to FIG. 4, in which the same reference numerals have been retained for the similar elements which have the same functions as with the case of the device shown in FIG. 3.

This example is of so-called well structure, in which a P-type Si region well 19 is formed in the vicinity of the surface of an N-type Si substrate 18. Further, pixel transistors of N-channel MOSs are formed in this well 19.

In this device, the P-type well 19 is set to the ground potential, and the N-type Si substrate 18 is biased at a positive potential. In FIG. 4, holes 160A and electrons 150A are photo-carriers generated in the Si substrate 18 deeply below the well bottom. The holes 160A are absorbed into the P-type well 19. The electrons 150A are absorbed into the N-type Si substrate 18. As a result, it is possible to prevent photo-carriers from entering into the drain 8 of the MOS transistor. This method is effective against the light entering deeply into the Si substrate 18 beyond the bottom of the well 19.

Also shown in FIG. 4 are holes 160B and electrons 150B, the photo-carriers generated by light already absorbed by Si atoms within the well 19. The holes 160B flow to the ground. However, the electrons 150B enter the drain 8. The rate of the photo-carriers entering the drain 8 depends on the depth of the well 19. In the ordinary depth of the well (e.g., about 3 μm), a considerable amount of photo-carriers enter the drain 8. In general, the light absorption rate in shallow region of the substrate surface increases with decreasing wavelength thereof. In this method, therefore, the pixel potential is easily shifted in the case of blue light.

As described above, in the prior art countermeasures against the photo-carriers, there inevitably exist various problems such as: complication of the manufacturing process; an increase in manufacturing cost; a decrease in manufacturing yield; a decrease in performance due to the dispersion of angles of incidence of light; a difficulty of color image display, a rise in driving voltage; a harmful influence upon the device operation due to generated heat; a harmful influence by light absorbed in shallow region, etc.

SUMMARY OF THE INVENTION

With these problems in mind, therefore, it is the object of the present invention to provide an active matrix device and a method of driving the same device, which can solve the problems involved in the prior art active matrix devices and which can suppress the drain potential shift due to photo-carriers as much as possible, without adding any special process and without exerting a harmful influence upon the operation of the pixel transistors.

To achieve the above-mentioned object, the present invention provides an active matrix device comprising: a plurality of switching transistors arranged into a matrix pattern on a semiconductor substrate of a first conductivity type; signal lines for supplying data to sources of the transistors; gate lines for controlling turn-on and -off operation of the transistors; pixel electrodes connected to drains of the transistor; semiconductor regions of a second conductivity type opposite to the first conductivity type, formed into wells in the semiconductor substrate so that the semiconductor regions are separated from each other by portions of the semiconductor substrate; the transistors being formed in the semiconductor regions.

The active matrix may further include an auxiliary capacitance electrode formed at least on each portion of the semiconductor substrate, via an insulating film, the auxiliary capacitance electrode being electrically connected to each pixel electrode and forming capacitance between the auxiliary electrode and the semiconductor substrate.

The active matrix may further include a drive circuit for driving the active matrix device, formed on the semiconductor substrate, the drive circuit being formed in a part of the semiconductor regions, the part of the semiconductor regions being electrically isolated from the semiconductor regions in which the transistors are formed.

The active matrix may further include a level shift circuit for converting signal levels of the driving circuit to signal levels of the transistors, the level shift circuit being formed between the drive circuit section and the transistors.

The semiconductor substrate and the semiconductor regions may be reverse-biased with respect to each other.

The active matrix may further include: an electro-optical section connected to the pixel electrodes; and an auxiliary electrode connected to the electro-optical section, for applying electric fields to the electro-optical section, wherein the semiconductor substrate is biased at potential that varies periodically and is reverse-biased with respect to the semiconductor regions, and phase of the varying potential period is in phase with the auxiliary electrode.

DETAILED DESCRIPTION OF THE EMBODIMENTS

Preferred embodiments of the active matrix device and the method of driving the same device according to the present invention will be described hereinbelow with reference to the attached drawings.

Figure 3:
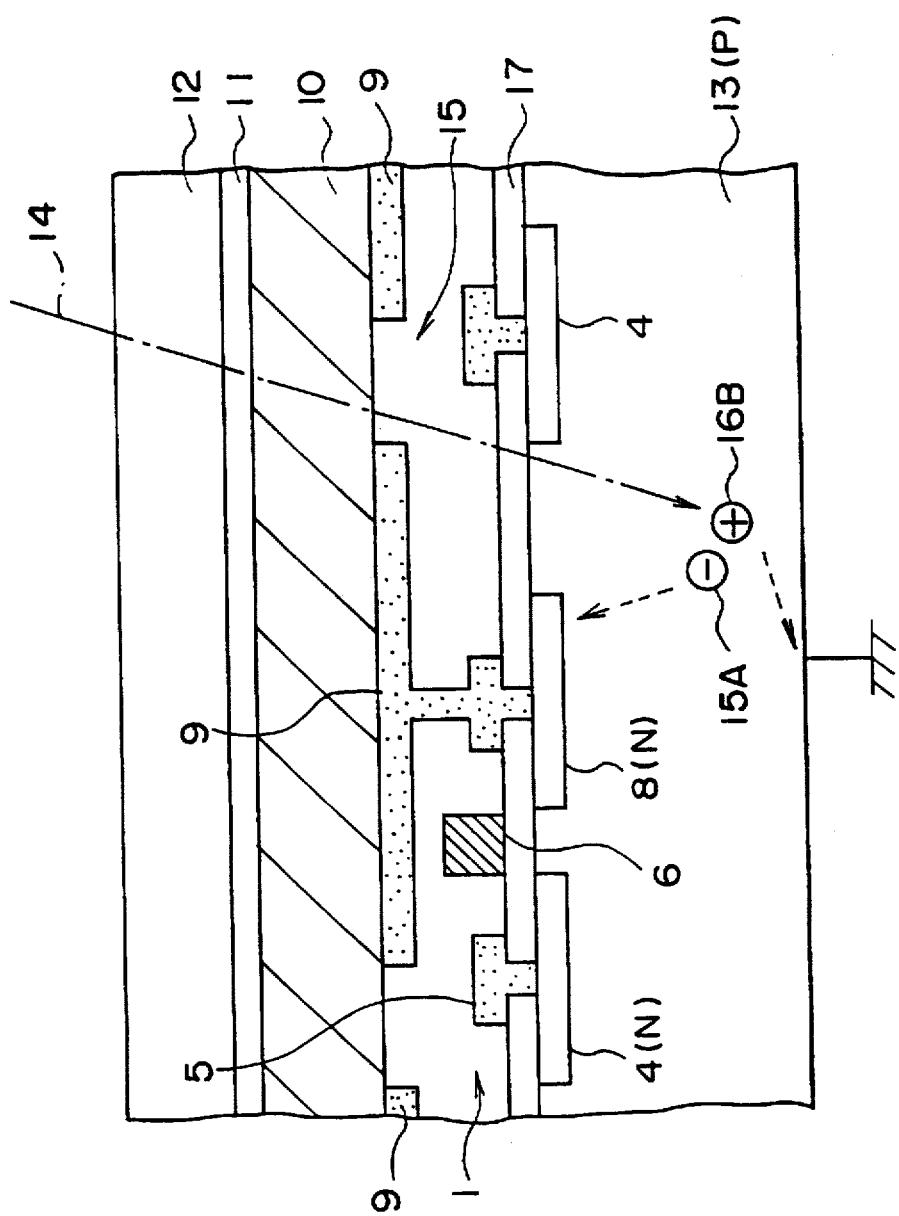
FIG. 3 is a cross-sectional view showing a pixel of the conventional reflective-type active matrix device using a silicon substrate.
Figure 4:
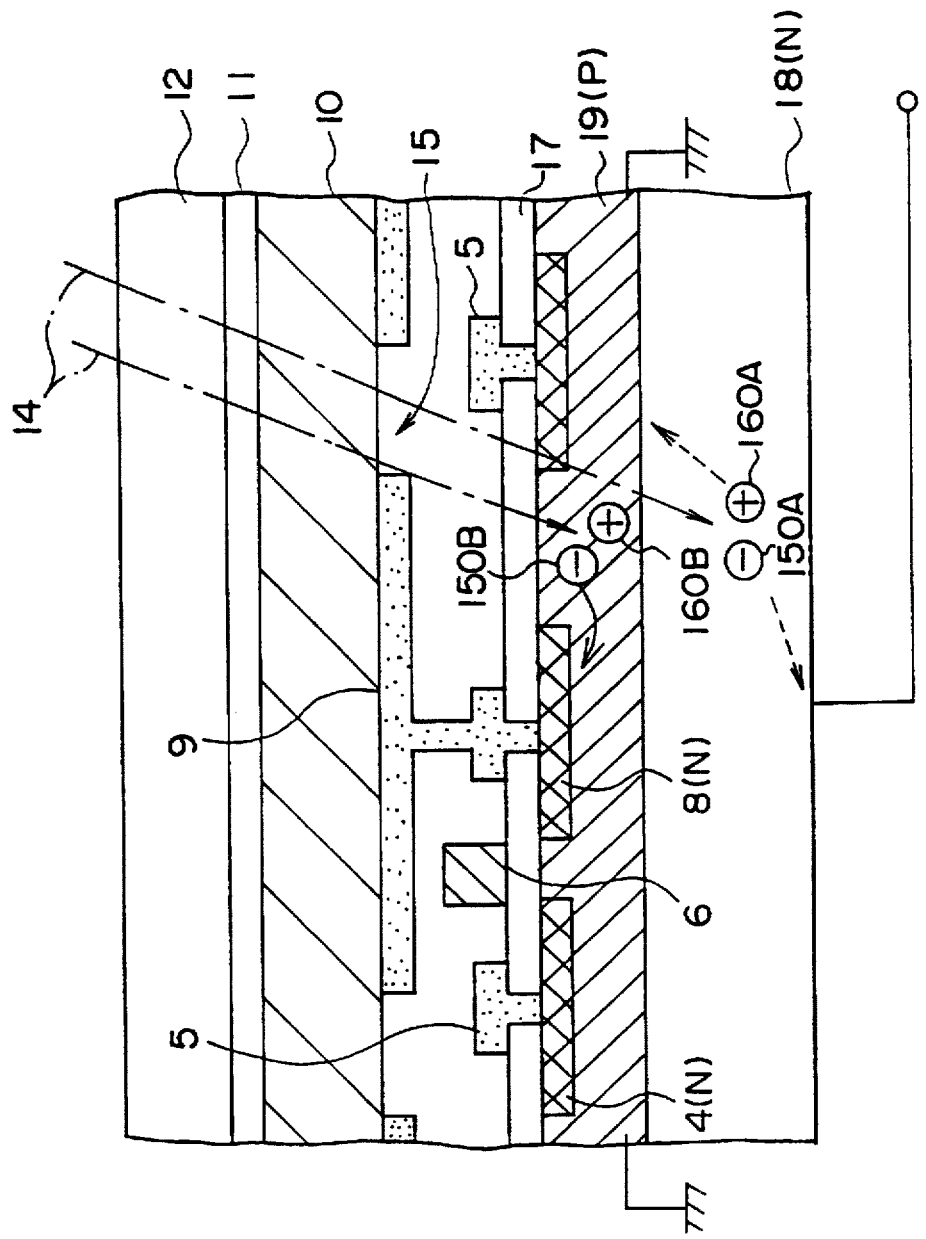
FIG. 4 is a cross-sectional view showing the other example of the pixel of the conventional reflective-type active matrix device using the silicon substrate.
Figure 5:
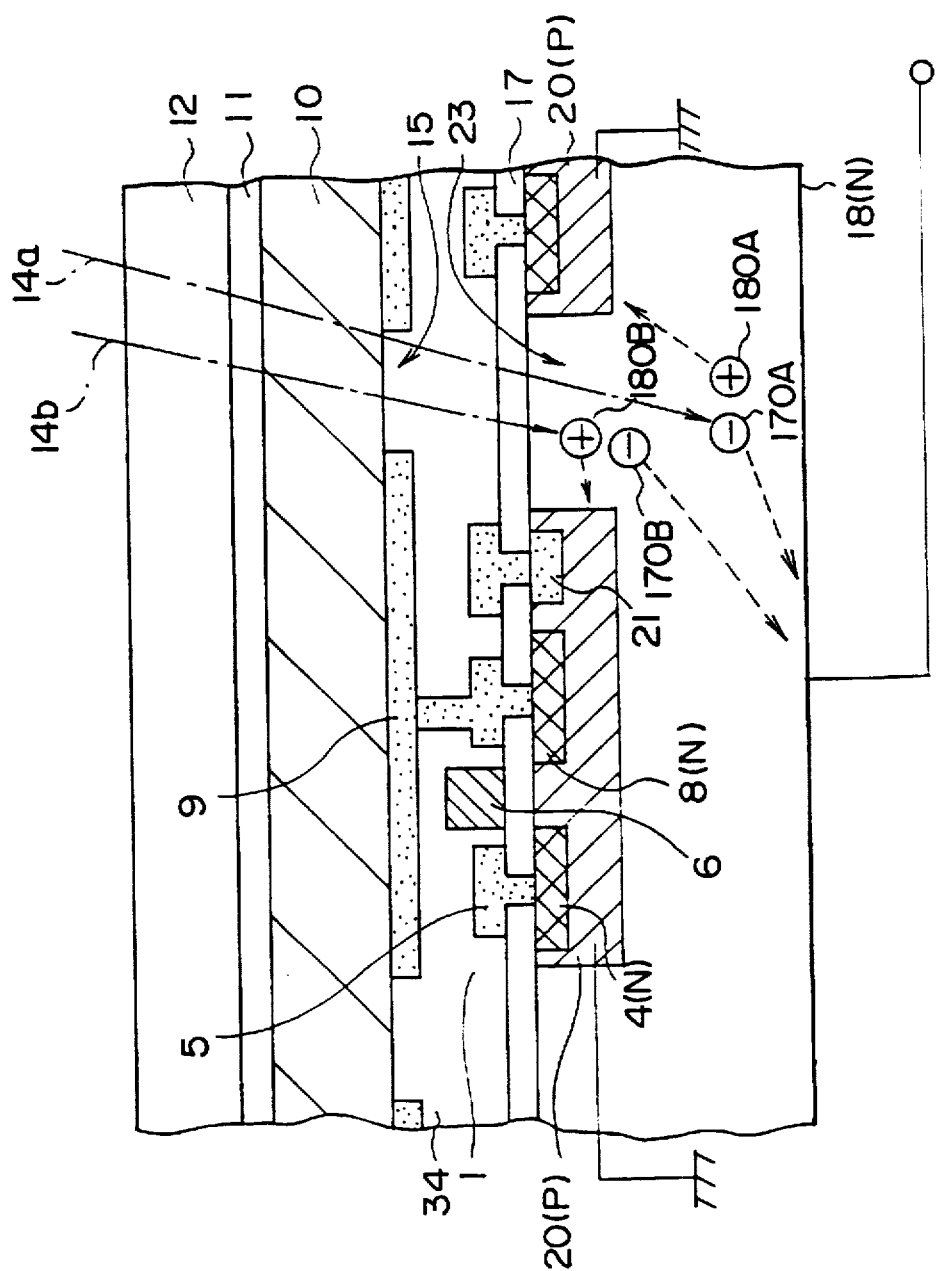
FIG. 5 is a partial enlarged cross-sectional view showing an embodiment of the active matrix device according to the present invention.
Figure 6:
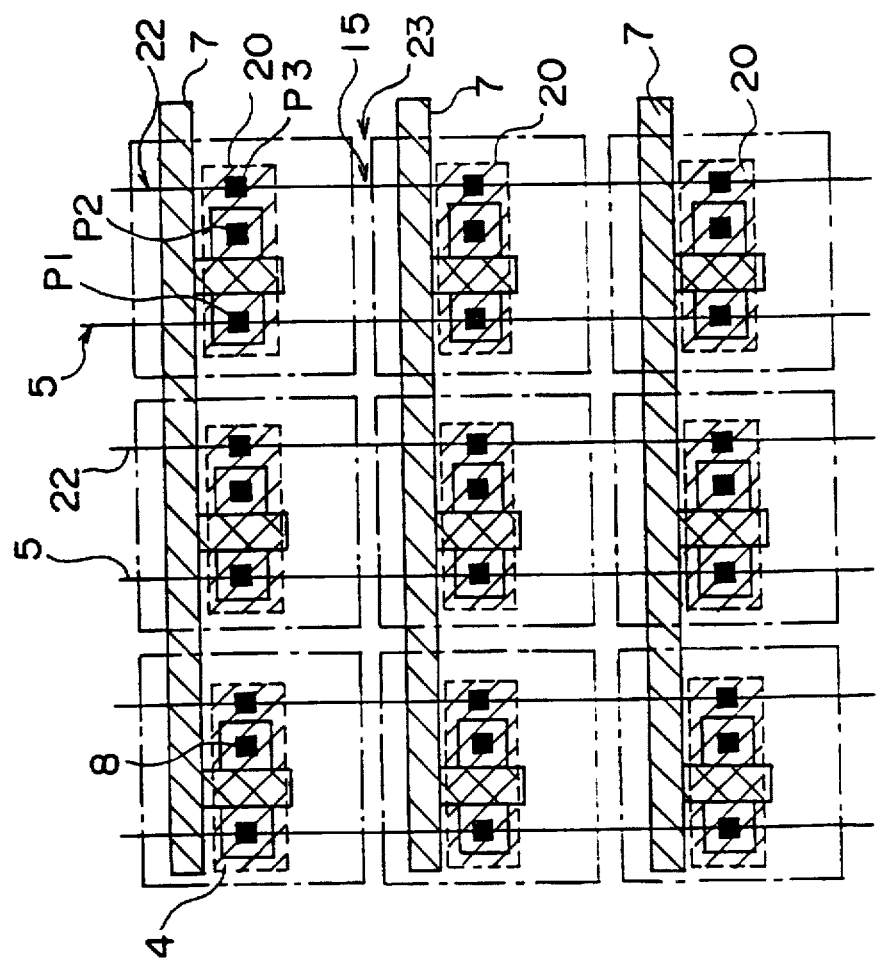
FIG. 6 is a plan view showing the same device show in FIG. 5.

FIG. 5 is a partial enlarged view showing an embodiment of the active matrix device according to the present invention. FIG. 6 is a plane view showing the same device. In the figures, the same reference numerals have been retained for the similar elements which have the same functions as with the case of the conventional device shown in FIGS. 3 and 4.

The device has an N type (a first conductivity type) semiconductor substrate 18 of Si mono-crystal. Near the surface of this substrate 18, semiconductor regions each isolated into island shape (i.e., wells) 20 are formed and arranged into a matrix pattern. These wells are of P type (a second conductivity type) semiconductor regions.

Figure 1:
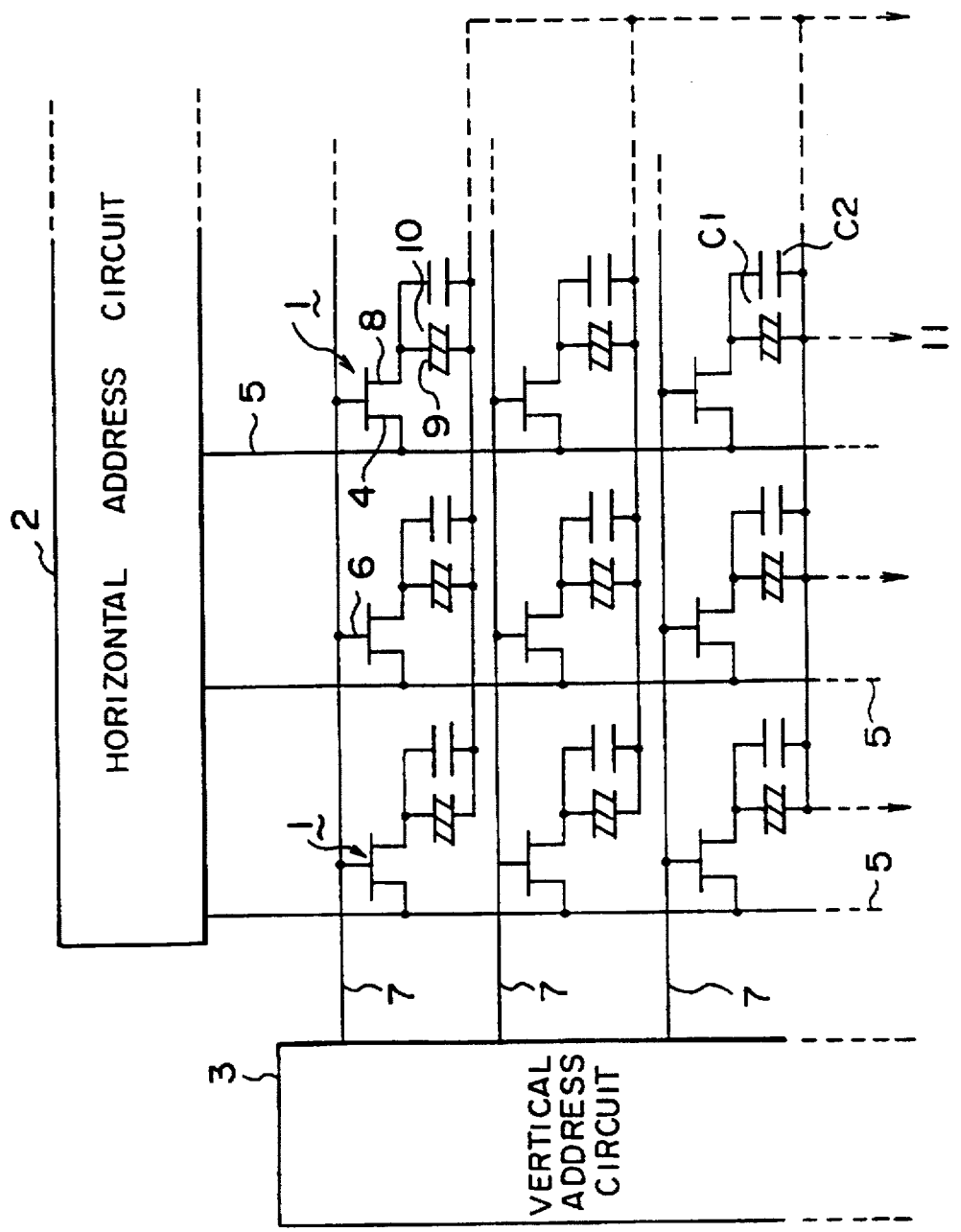
FIG. 1 is a circuit diagram showing a conventional active matrix device used for liquid crystal display.
Figure 2:
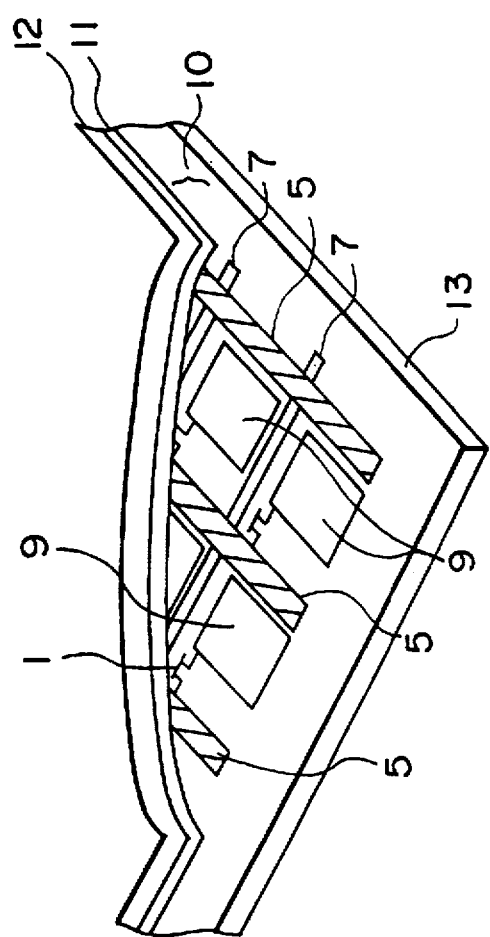
FIG. 2 is a perspective, partially broken view showing the same device shown in FIG. 1.

In each well 20, a switching transistor (e.g., field effect transistor) 1 is formed as a pixel transistor. These switching transistors are arranged also into a matrix pattern as a whole. The transistors 1 are driven by a horizontal address circuit 2 and a vertical address circuit 3 both as shown in FIG. 1.

A gate 6 of each transistor 1 is formed on each well 20 via a gate oxide film 17. The N-type source 4 of each transistor 1 is connected to a signal line 5; its N-type drain 8 is connected to a pixel electrode 9; and its gate 6 is connected to a scanning line 7, all as shown in FIG. 1.

Pixel electrodes 9 are also arranged into a matrix pattern on the substrate (on which the transistors are formed) via an interlayer insulating film 34 of $SiO_2$. Formed over the pixel electrodes 9 is an electrode 11 for covering all the pixel transistors. The electrode 11 is provided so as to face the pixel electrodes 9 with a liquid crystal 10 intervened between the pixel electrodes 9 and the electrode 11. Further, a transparent substrate 12 is formed on the surface of the electrode 11.

A well contact electrode 21 (FIG. 5) is formed on each P-type well 20 and is connected to a common well wire 22 (FIG. 6).

Since each well 20 is arranged into an island shape as already explained, each substrate surface between two adjacent wells 20 is formed as an N type region 23 conductive to the N type Si substrate 18. This is the feature of the present invention.

Each N-type region 23 is preferably formed under a gap 15 between two adjacent pixel electrodes 9 so as to receive the incident light 14 leaking through the gap 15.

In FIG. 6, a point P1 is a junction of the source of the transistor to the signal line 5; a point P2 is a junction of the drain of the transistor to the pixel electrode 9; and a point P3 is a junction of the well 20 to a well wire 22.

The operation of the device constructed as above will be described hereinbelow.

First, a reverse bias voltage is applied between the N-type Si semiconductor substrate 18 and the P-type well 20 that is set to the ground potential.

Here, when beams of light 14a and 14b are allowed to be incident upon the N-type semiconductor region 23 and substrate 18 through the gap 23 between two adjacent pixel electrodes 9, photo-carriers are generated everywhere in the substrate 18. Among the photo-carriers, an electron 170A and a hole 180A are generated by the beam of light 14a reaching the deep region below the bottom of the P-type well 20. On the contrary, an electron 170B and a hole 180B are generated by the beam of light 14b reaching the shallow region of the substrate 18 (i.e., in the N-type region 23).

The electron 170A are absorbed by the substrate 18, and the holes 180A are absorbed by the P-type well 20 reverse-biased relative to the substrate 18.

Further, since the N-type region 23 is biased at a positive potential, the electrons 170B are absorbed by the semiconductor substrate 18 conductive to the N-type region 23; and the holes 180B are absorbed by the P-type well 20.

Consequently, even if photo-carriers are generated everywhere in the substrate 18, the generated electrons will not enter the drain 8 formed in each P-type well 20. It is thus possible to maintain the potential of each drain 8 at the initial potential applied to each signal line 5 without fluctuations of the potential at the pixel electrode 9. In other words, since the potential will not be shifted at each pixel electrode, it is possible to display picture under excellent characteristics.

Further, in order to suppress the harmful influence of photo-carriers, it is preferable to reduce the quantity of light transmitting to the substrate 18. For this purpose, the pixel electrodes 9 are preferably formed of an opaque substance, such as aluminum, silver, titanium, etc., for instance.

Figure 7:
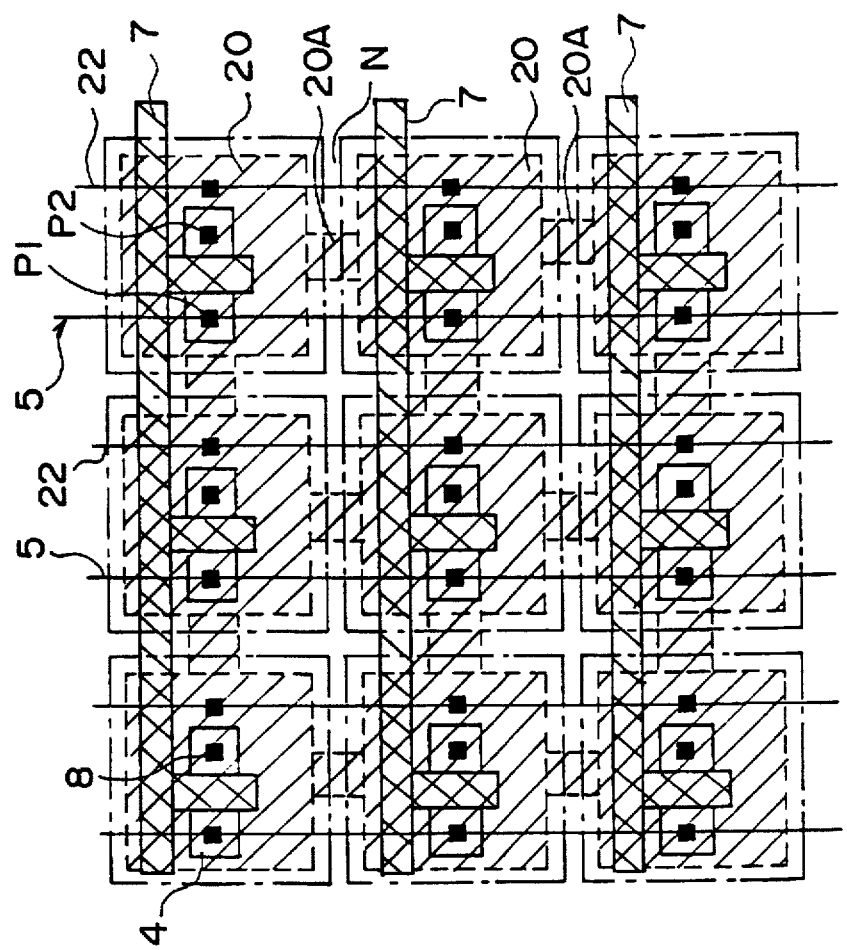
FIG. 7 is a plane view showing the state where adjacent wells are electrically connected one another partially.

Further, in this embodiment, the P-type well 20 is formed being isolated into island shape on the surface of the substrate 18. Without being limited only thereto, however, when the wells are formed, as shown in FIG. 7, it is possible to partially connect the adjacent P-type wells 20 one another through connection portions 20A under a perforated shape. In this structure, it is possible to eliminate the wire 22 for connecting the P-wells. Further, in this case, although the photo-carries generated at the connection portions 20A are absorbed to the drains 8, the harmful influence of the photo-carriers is to such an extent as to be disregarded and therefore negligible. Because the area of the connection portions 20A is considerably small as compared with the area of the N-type regions 23.

Another preferred embodiment of the active matrix device according to the present invention will be explained. In this embodiment, an auxiliary capacitor section is additionally formed in close vicinity of a pixel transistor in order to maintain the potential of a pixel electrode.

Figure 8:
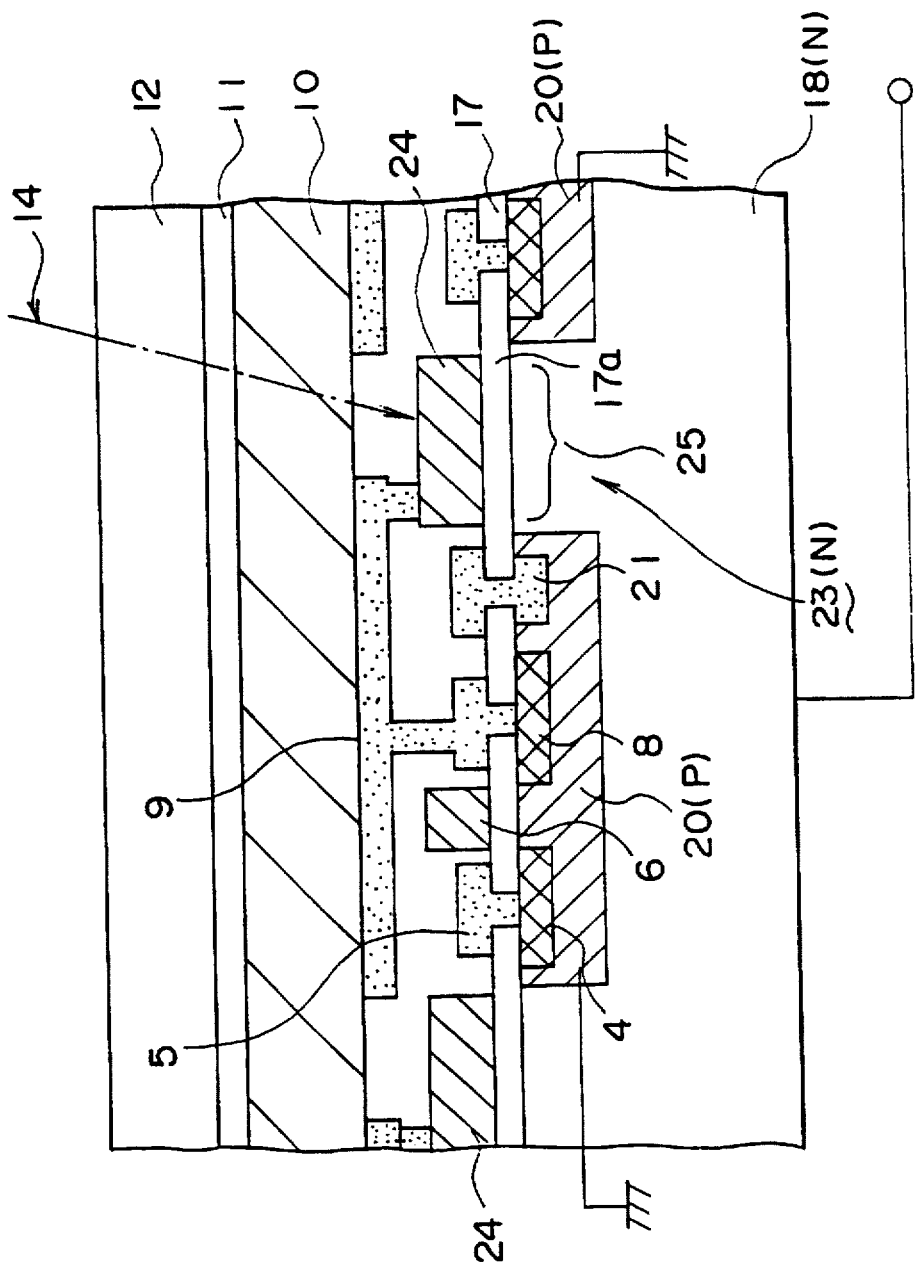
FIG. 8 is a partial enlarged cross-sectional view showing another embodiment of the active matrix device according to the present invention.
Figure 9:
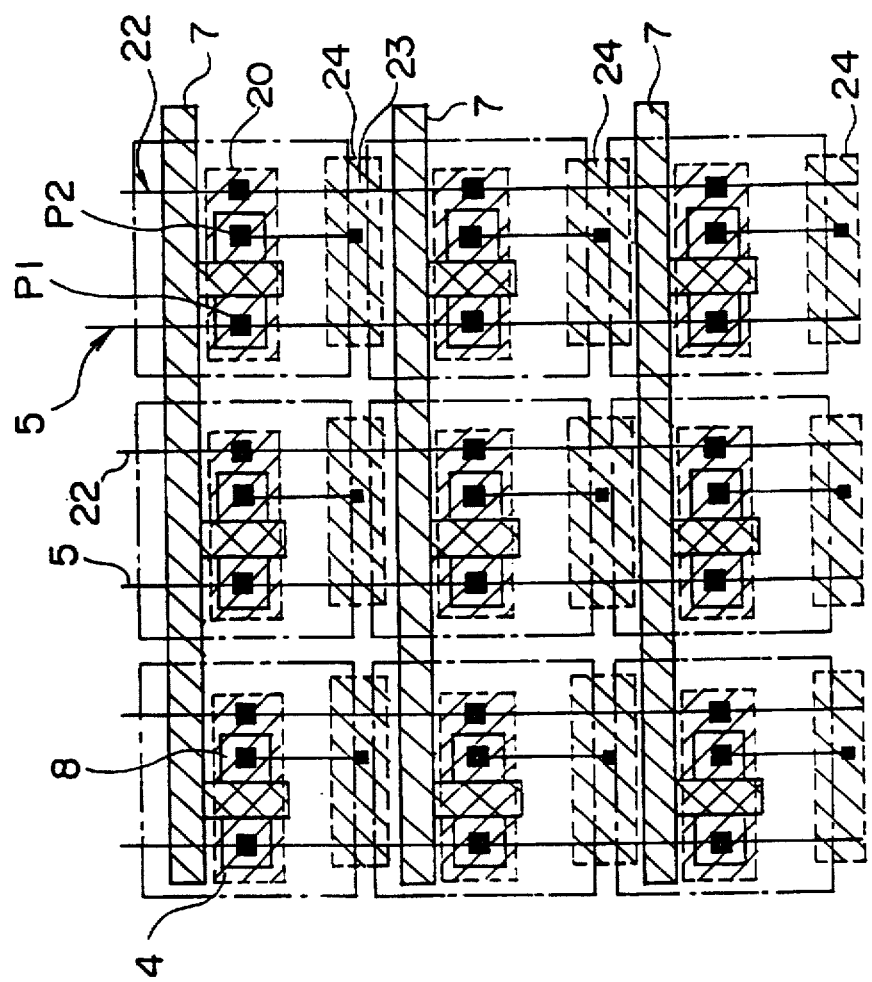
FIG. 9 is a plan view showing the same device show in FIG. 8.

FIG. 8 is an enlarged cross-sectional view of this embodiment. FIG. 9 is a plane view of the same device. In the figures, the same reference numerals have been retained for the similar elements having the same functions as with the case of the device shown in FIG. 5, without repeating any description thereof.

In the device shown in FIG. 8, N-type regions 23 are provided, each formed on the surface of a substrate 18 via an insulating film 17a of $SiO_2$ that is the same as the gate oxide film 17 of $SiO_2$. And an auxiliary capacitance electrode 24 of polysilicon is formed on each N-type region 23. Therefore, an auxiliary capacitance portion 25 is formed between the auxiliary capacitance electrode 24 and the semiconductor substrate 18. The auxiliary capacitance electrode 24 is formed of polysilicon whose conductivity type is the same as that of the gate 6. The $SiO_2$ insulating film 17a can be formed under the auxiliary capacitance electrodes 24 during the process for forming the gate oxide film 17.

The auxiliary capacitance electrodes 24 are electrically connected to the drains 8 of the pixel transistors and further to the pixel electrodes 9 formed on the drains 8. Further, as described, the capacitance of the auxiliary capacitance portion 25 is formed between the auxiliary capacitance electrode 24 and the N-type semiconductor region 23. This capacitance is determined about 10 times larger than that of the liquid crystal 10 sandwiched between the pixel electrodes 9 and the electrode 11. The auxiliary capacitance servers to suppress the shift of the potential at the pixel electrode 9.

An example of the active matrix device provided with such an auxiliary capacitance sections is disclosed in Japanese Published Unexamined Patent Application No. 5(1993)-273592 or 6(1994)-027492.

In this embodiment, the potential of the N-type semiconductor region 23 is biased at a positive potential. It is thus apparent that electrons of the photo-carriers generated in the Si substrate 18 can be absorbed in the same way as with the case of the device shown in FIG. 5. In other words, in this embodiment, since the N-type semiconductor region 23 is provided with both the functions as a photo-carrier sink and an electrode of the auxiliary capacitance portion 25, no additional space is required for the auxiliary capacitance portion 25.

The method of manufacturing the above-mentioned active matrix device shown in FIGS. 8 and 9 will be explained hereinbelow with reference to FIGS. 10A to 10D.

Figure 10A:
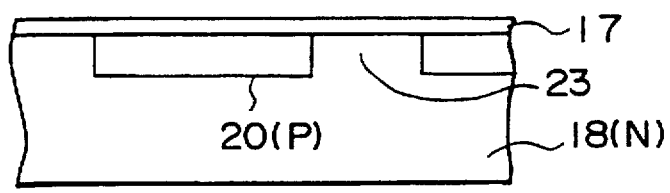
FIGS. 10A to 10D are cross-sectional views showing the manufacturing process of the device shown in FIG. 8.

As shown in FIG. 10A, the P-type semiconductor well regions 20 are formed on some parts of the surface of the N-type silicon mono-crystal semiconductor substrate 18 by photolithography and ion implantation. After that, the gate oxide film 17 is formed by thermal oxidization. Consequently, the regions in which the P-type wells 20 are not formed automatically become the N-type semiconductor regions 23.

Figure 10B:
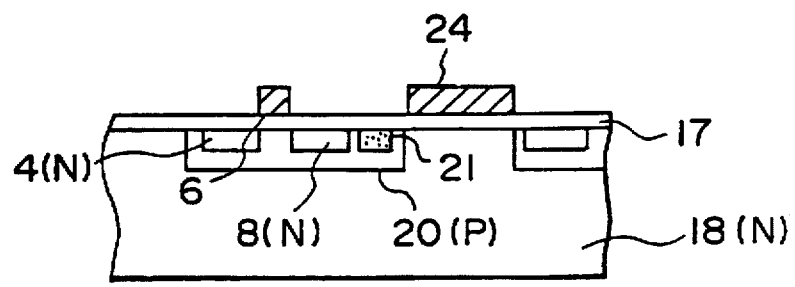

Then, as shown in FIG. 10B, after a polysilicon film (not shown) is deposited over the substrate 18 by the CVD method, the gates 6 and the auxiliary capacitance electrodes 24 are both formed by etching. Further, the sources 4 and the drains 8 are formed by ion implantation in self-alignment manner by using the gate polysilicon as a mask. In this process, the well contact regions 21 are also formed by P-type ion implantation.

Figure 10C:
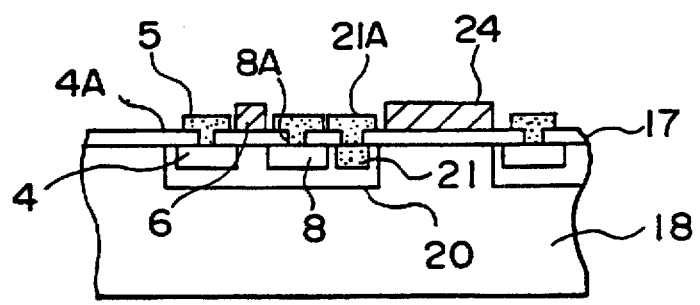

Further, as shown in FIG. 10C, after contact holes are formed by etching, source electrodes 4A, drain electrodes 8A and well contact electrodes 21A are formed.

Figure 10D:
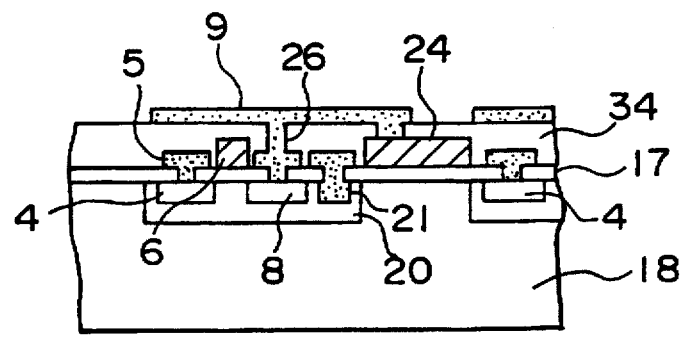

After that, as shown in FIG. 10D, an interlayer insulating film 34 is deposited and holes 26 are formed in the interlayer insulating film 34. Further, the pixel electrodes 9 are formed on the interlayer insulating film 34.

Figure 11:
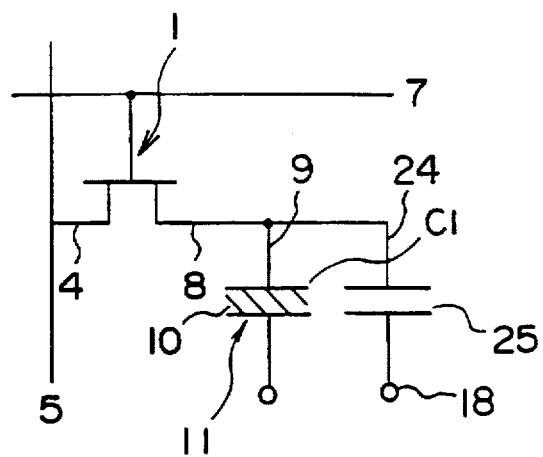
FIG. 11 is an equivalent circuit diagram of the device shown in FIG. 8.

Here, the bias potential applied to the N-type semiconductor regions 23 of the embodiment shown in FIG. 8 will be explained hereinbelow with reference to FIG. 11. FIG. 11 is an equivalent circuit of the device shown in FIG. 8.

When the MOS transistor 1 is turned on, a potential according to the voltage of the signal line 5 connected to the source 4 is applied to the drain 8. After that, even if the transistor is turned off, the same potential is held at the drain 8. As described above, the auxiliary capacitance portion 25 serves to increase the time constant of this potential holding operation. In the case where the electrode 11 is biased at a constant potential, it is apparent that the above-mentioned operation can be attained, as far as the potential at the auxiliary capacitance portion (the N-type semiconductor region) 23 is kept at a constant potential. The constant potential to the auxiliary capacitance portion 23 is not required to be the same potential as that of the electrode 11.

Here, the operation that the applied bias potential is inverted per field will be explained hereinbelow.

When the bias potential is applied, there exists the case where two potentials inverted per field on both sides of a central potential are applied to the electrode 11 of the active matrix device shown in FIG. 8 in order to reduce the voltage load applied to the active matrix.

In general, the characteristics of the liquid crystal 10 tend to deteriorate when a unidirectional voltage is kept applied. Therefore, in usual, the voltage is applied to the liquid crystal 10 such that the field direction is inverted at a certain frequency (e.g., the field frequency).

To invert the potential of the electrode 11, the following driving method is adopted. That is, a voltage corresponding to the threshold value of the liquid crystal 10 is applied to the electrode 11 in such a way that the potential is inverted per field at this threshold voltage. In addition, the voltage with reverse phase of the voltage applied to the electrode 11 is applied to the active matrix, with the value corresponding to video signals. This reduces the voltage load applied to the active matrix side. Examples of an active matrix device provided with such function is disclosed in Japanese Patent No. 61(1986)018755 and Japanese patent Laid-Open No. 3(1991)-135597.

Figure 12:
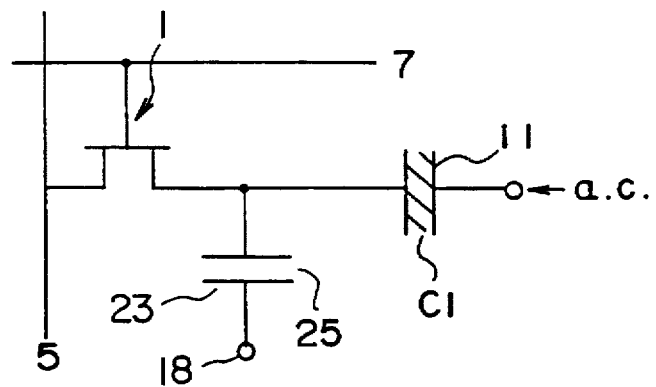
FIG. 12 is another equivalent circuit diagram of the device shown in FIG. 8.

In this case, when the N-type semiconductor region 23 is biased at a constant positive potential, the auxiliary capacitance portion 25 and the liquid crystal capacitance C1 can be regarded as being connected in series from the standpoint of alternative current source (a.c.), as shown by an equivalent circuit shown in FIG. 12. In this equivalent circuit, the liquid crystal field changes according to the inverted drive potential at the electrode 11 as expressed below:

Change in liquid crystal voltage=(change rate of potential at electrode 11)×Ca/(Ca+C1)

where Ca denotes the capacitance of the auxiliary capacitance portion 25; and C1 denotes the capacitance of the liquid crystal 10.

As described above, the capacitance of the auxiliary capacitance portion 25 is formed larger than that of the liquid crystal 10. In this case, however, the field applied to the liquid crystal 10 varies largely as expressed by the above formula. To overcome this problem, the potential of the N-type semiconductor region 23 is varied in the same way as the potential applied to the electrode 11. An example of this method is disclosed in Japanese Patent Laid-Open No. 2(1990)-000922.

Figure 13:
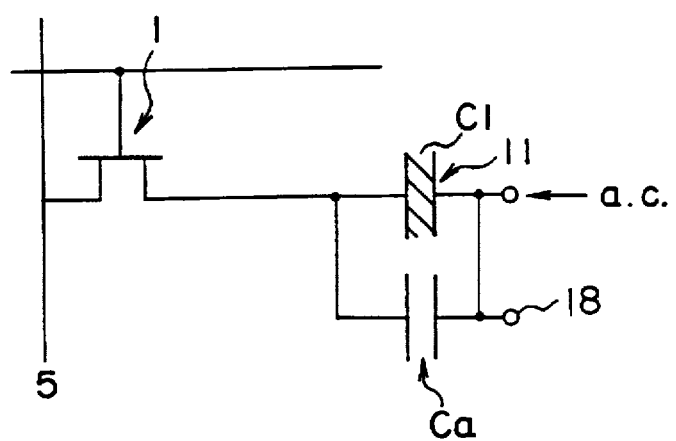
FIG. 13 is still another equivalent circuit diagram of the device shown in FIG. 8.

In this case, as shown by an equivalent circuit shown in FIG. 13, the liquid crystal capacitance C1 and the auxiliary capacitance Ca are connected in parallel to each other with respect to the alternative current source. Here, when the transistor 1 is turned off, the filed applied to the liquid crystal 10 will not change. Because these capacitances can be regarded as being floated on the transistor side even if the potential of the electrode 11 varies.

As described above, the driving method varies the potential of the substrate 18 periodically in a way that the substrate 18 is reverse-biased relative to the P wells 20 of FIG. 8. Further, this driving method makes the potential fluctuation period of the substrate 18 in phase with that of the electrode 11 for applying the electric field to the liquid crystal (any of electro-optical substances). It is thus possible to eliminate the harmful influence of photo-carriers and further to hold the liquid crystal field by best use of the function of the auxiliary capacitance.

In this case, further, it is apparent that the potential of the N-type semiconductor region 23 is not necessarily the same as that of the electrode 11, as far as both the potentials fluctuate in phase with each other.

Further, in the case where the above-mentioned driving method is applied to the device structure according to the present invention, the following advantages can be obtained: In general, in a liquid crystal panel using the active matrix, a considerably large space is required in practice, in addition to the area for displaying picture. The additional space is used for a margin and a peripheral space for sealing the liquid crystal, for instance. In this case, when a semiconductor substrate is confronted with an electrode, such as the electrode 11 of FIG. 8, a large electric capacitance is formed between the two. Here, if only this electrode is driven by an ac voltage, while biasing the N-type semiconductor region at a constant potential, since this capacitance is charged and discharged repeatedly, a power is consumed.

In the present invention, however, since the N-type semiconductor 18 and the electrode 11 are both driven in phase with each other as described above, it is possible to prevent the power consumption due to charge and discharge of the capacitance formed between the two, thus saving the power to be consumed.

Still another embodiment according to the present invention will be described hereinbelow with reference to FIGS. 14 and 15. In this case, the circuit for driving the active matrix device is integrated with the pixel transistors on the same substrate for forming the active matrix.

Figure 14:
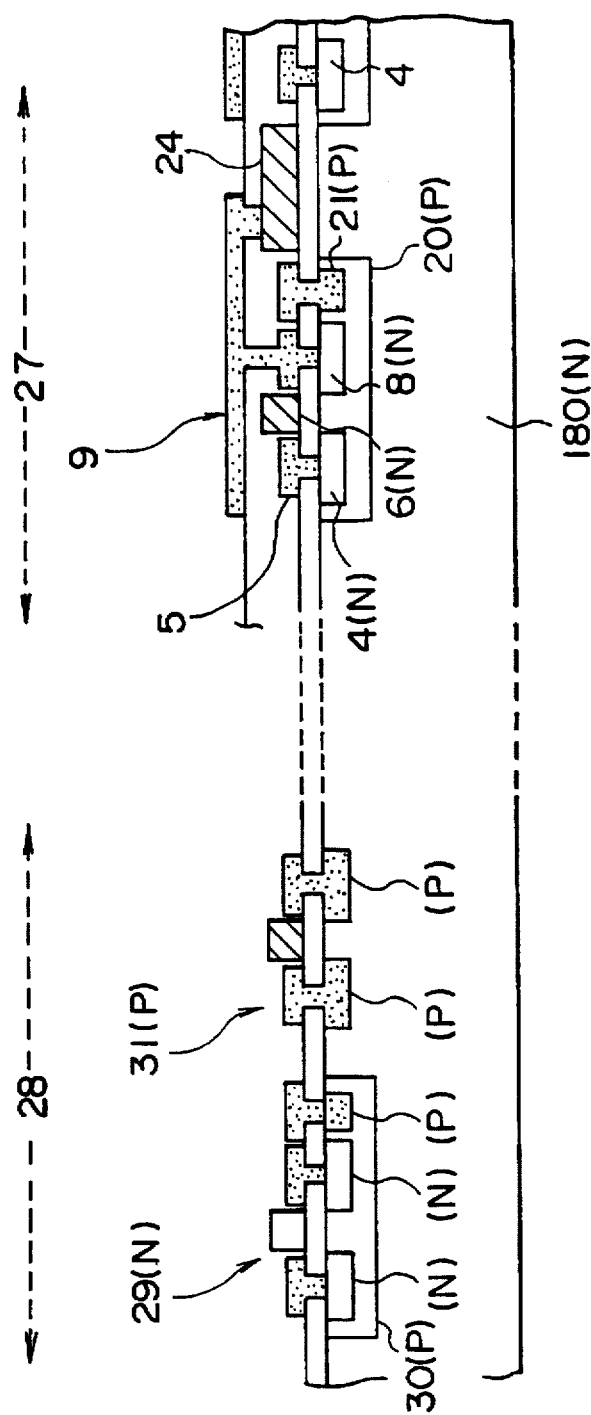
FIG. 14 is a partial enlarged cross-sectional view showing the case where the matrix section and the drive circuit section is formed on the same substrate.
Figure 15:
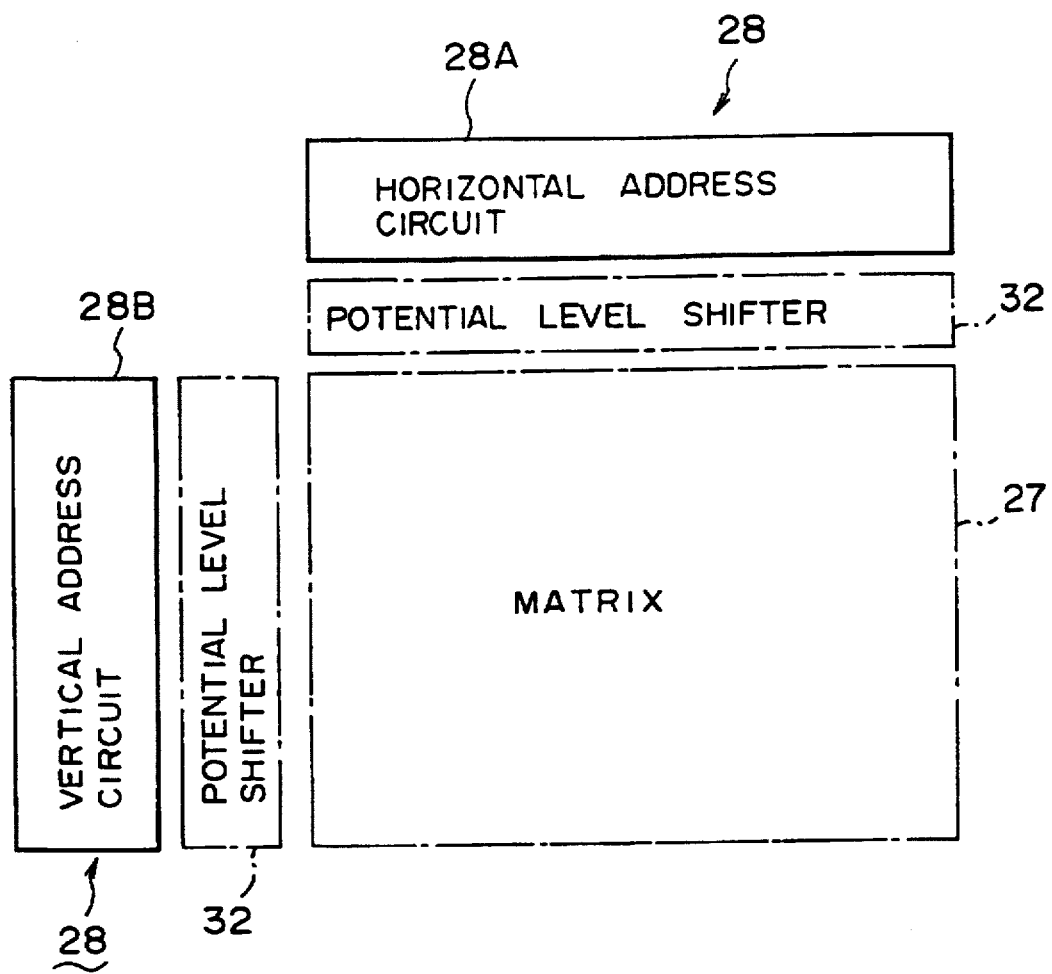
FIG. 15 is a plane view showing the device shown in FIG. 14.

FIG. 14 is an enlarged cross-sectional view, in which a matrix section 27 and a drive circuit 28 for driving the matrix section 27 are integrated on a substrate 180, and FIG. 15 is a plane view of the same. In FIG. 14, P and N denote a conductivity type of the elements and regions on the substrate 180. In FIG. 15, circuit blocks depicted by a solid line are driven in the range of 0 to +10 volts and those depicted by a dot line are driven in the range of −10 to +10 volts.

Here, the drive circuit 28 includes a horizontal address circuit section 28A and a vertical address circuit section 28B each composed of a shift register to determine respective pixel addresses. The drive circuit 28 is of CMOS circuit structure, in which an N-channel transistor 29 is formed in a P-type well 30 and a P-channel transistor 31 is formed in an N-type region (180). In this case, the P-type well 30 is electrically isolated from a P-type well 20 of a pixel portion of the matrix section 27.

The drive voltage conditions are as follows:

| | | |
|---|---|---|
| (a) | Common N-type semiconductor substrate 180: | +10 V |
| | Pixel P-type region (well) 20: | −10 V |
| | Drive circuit P-type region: | 0 V |
| (b) | Common N-type semiconductor substrate: | +20 V |
| | Pixel P-type region (well): | 0 V |
| | Drive circuit P-type region: | +10 V |
| (c) | Common N-type semiconductor substrate: | 0 V |
| | Pixel P-type region (well): | −20 V |
| | Drive circuit P-type region: | −10 V |

Figure 16:
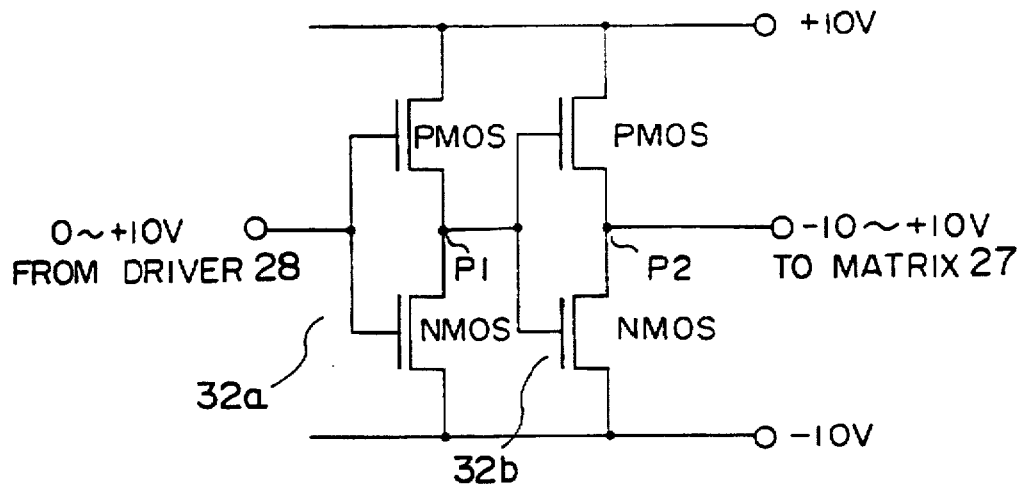
FIG. 16 is a circuit diagram showing an example of a potential level shifter formed between the drive circuit section and the matrix section.
Figure 17:
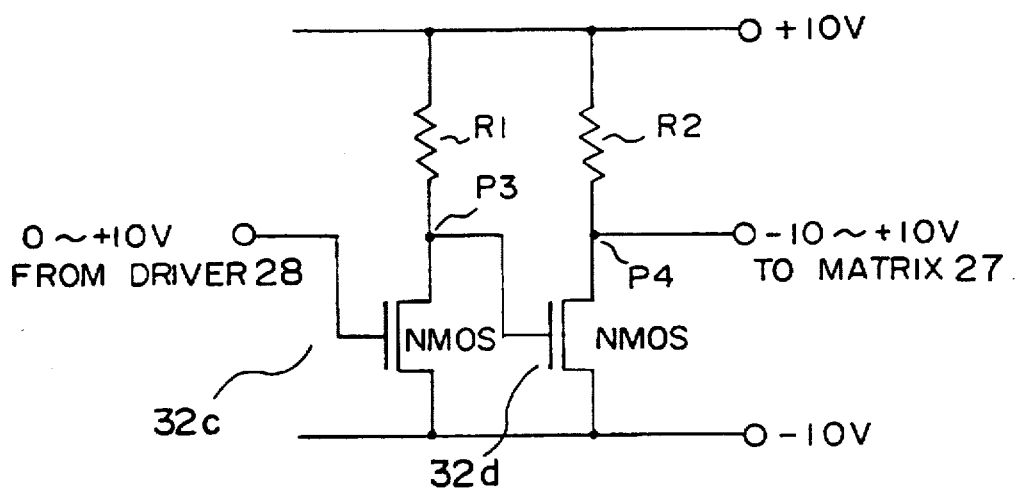
FIG. 17 is a circuit diagram showing another example of the potential level shifter formed between the drive circuit section and the matrix section.

In the case of the above condition (a), the matrix section 27 is driven in as wide a dynamic range as from −10 V to +10 V, and the drive circuit section 28 is driven in a narrow range from 0 V to 10 V for high speed operation. For adjustment of the potential difference between the drive circuit section 28 and the matrix section 27, a potential level shifter 32 (FIG. 15) is provided. FIG. 16 shows a CMOS inverter as the potential level shifter. FIG. 17 shows a source follower circuit as the potential level shifter. The potentials obtained when these potential level shifters are shown in condition (a).

The potential level shifter 32 shown in FIG. 16 is provided with series-connected circuits 32a and 32b each composed of a PMOS transistor and an NMOS transistor. The junction point P1 of the two transistors of the circuit 32a is connected to the gates of the transistors of the circuit 32b. Further, the junction point P2 of the two transistors of the circuit 32b is connected to the matrix section 27 (FIG. 15). An output (0 to +10 V) of the drive circuit section 28 (FIG. 15) is applied to the gates of the transistors of the circuit 32a. The level-shifted output (−10 to +10 v)appearing at the junction point P2 is applied to the matrix section 27.

The potential level shifter 32 shown in FIG. 17 is provided with series-connected circuits 32c and 32d each composed of a resistor (R1 or R2) and an NMOS transistor. The junction point P3 of the resistor R1 and the transistor of the circuit 32c is connected to the gate of the transistor of the circuit 32d. Further, the junction point P4 of the resistor R2 and the transistor of the circuit 32d is connected to the matrix section 27 (FIG. 15). Also in this circuit, an output (0 to +10 V) of the drive circuit section 28 (FIG. 15) is applied to the gates of the transistors of the circuit 32c. And the level-shifted output (−10 to +10 v)appearing at the junction point P4 is applied to the matrix section 27.

Figure 18:
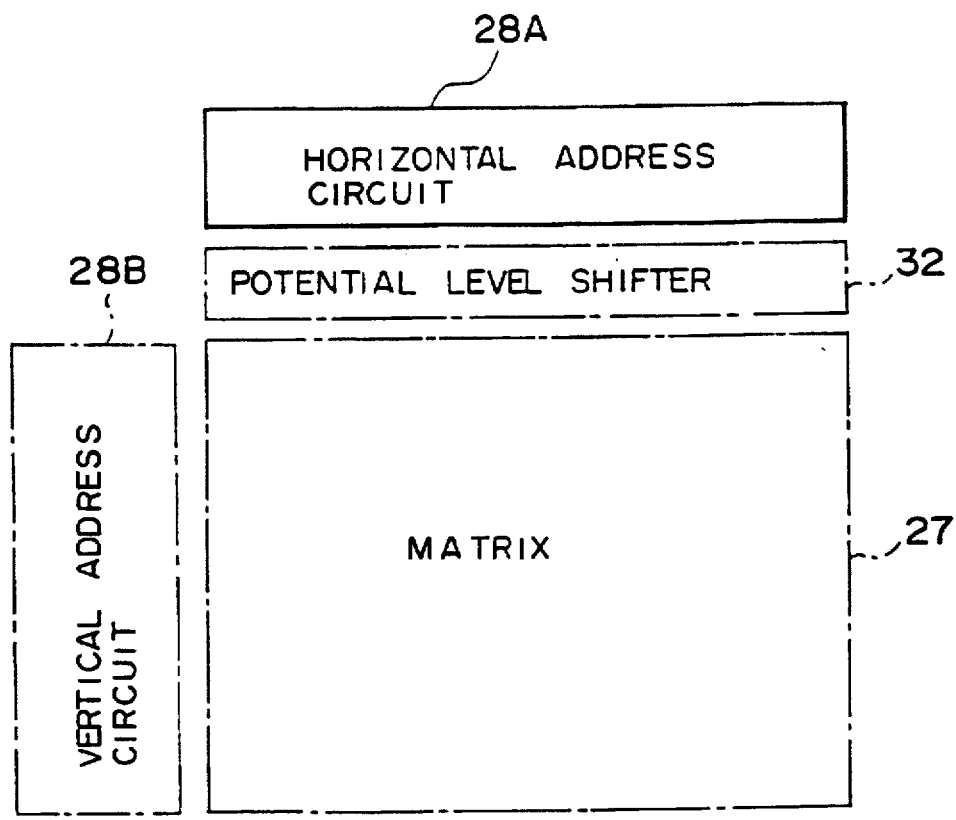
FIG. 18 is a plane view showing a potential level shifter formed only between the horizontal address circuit section and the matrix section.

FIG. 15 shows that both the horizontal and vertical address circuits 28A and 28B (P-type regions) are set to potentials different from that of the matrix section 27 (P-type region). Without being limited only thereto, however, it is possible to construct the device, as shown in FIG. 18 in such a way that the potential level shifter 32 is provided for only the horizontal address circuit section 28A to set another potential. In FIG. 18, the circuit block depicted by a solid line is driven in the range of 0 to +10 volts and those depicted by a dot line are driven in the range of −10 to +10 volts. Further, it is also possible to construct the device in such a way that the potential level shifter 32 is provided for only the vertical address circuit section 28B to set another potential.

Figure 19:
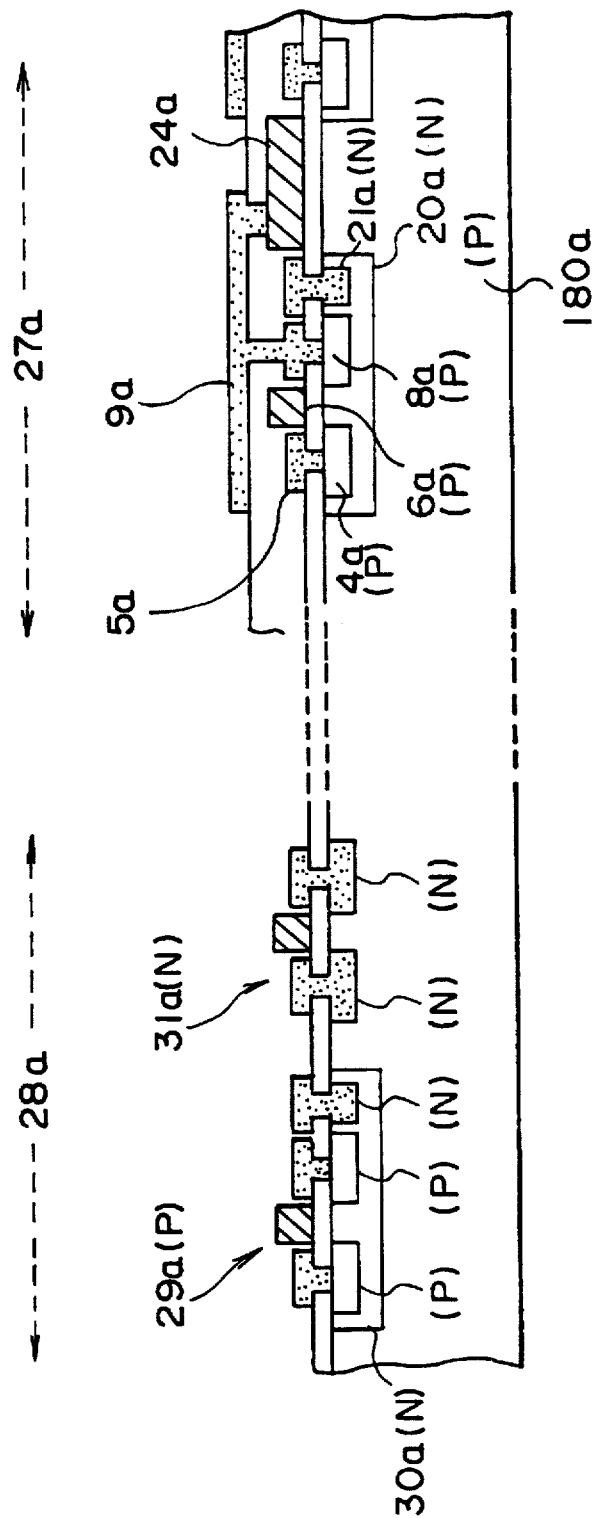
FIG. 19 is a partial enlarged view showing a similar device shown in FIG. 14, in which N-type and P-type are exchanged with each other.

Further, FIG. 19 shows another embodiment, in which the N-type and P-type conductivities of the semiconductor transistors shown in FIG. 14 are perfectly replaced with each other.

FIG. 19 is an enlarged cross-sectional view, in which a matrix section 27a and a drive circuit 28a for driving the matrix section 27a are integrated on a substrate 180a. A plan view of the circuit is the same as shown in FIG.15 and hence it is not shown here. In FIG. 19, P and N denote a conductivity type of the elements and regions on the substrate 180.

Here, the drive circuit 28a includes a horizontal address circuit section and a vertical address circuit section each composed of a shift register to determine respective pixel addresses like shown in FIG. 15. The drive circuit 28a is of CMOS circuit structure, in which a P-channel transistor 29a is formed in a N-type well 30a and an N-channel transistor 31a is formed in a P-type region (180a). In this case, the N-type well 30a is electrically isolated from an N-type well 20a of a pixel portion of the matrix section 27a.

In this case, the drive voltage conditions are as follows:

| | | |
|---|---|---|
| (d) | Common P-type semiconductor substrate 180a: | −10 V |
| | Pixel N-type region (well) 20a: | +10 V |
| | Drive circuit N-type region: | 0 V |
| (e) | Common P-type semiconductor substrate: | 0 V |
| | Pixel N-type region (well): | +20 V |
| | Drive circuit N-type region: | +10 V |
| (f) | Common P-type semiconductor substrate: | −20 V |
| | Pixel N-type region (well): | 0 V |
| | Drive circuit N-type region: | −10 V |

As described above, the matrix section 27a and the drive circuit section 28a are formed on the same substrate, it is thus possible to eliminate wires for connecting both sections. Further, the active matrix section 27a (well region) and the drive circuit section 28a (well region) are electrically isolated from each other. It is thus possible to drive the drive circuit section required to be operated at high speed operation, at a relatively low voltage. Therefore, the load of external circuits can be reduced.

In the above-mentioned embodiments, although a Si substrate is used by way of example. Without being limited only thereto, it is apparent that the same effect can be obtained by using another semiconductor other than Si. Further, in the active matrix device according to the present invention, it is unnecessary to adder a new additional process to the ordinary manufacturing process for MOS transistors.

As described above, in the active matrix device and the method of driving the same device according to the present invention are provided with the following effects:

A harmful influence can be almost prevented that is caused when light of high intensity is allowed to be incident upon the device and thereby generated photo-carriers enter the drains of the pixel transistors. It is thus possible to prevent the pixel electrode potentials from fluctuations, so that the active matrix device can be operated stably. As a result, a display high in brightness and excellent in display quality can be obtained.

Further, another harmful influence can be also prevented that is caused by the light leaking through the gaps between the pixel electrodes. In particular, it is possible to eliminate the harmful influence due to the photo-carriers of short wavelengths generated in a shallow region of the semiconductor substrate.

Further, in the construction in which the auxiliary capacitance portions are formed, it is possible to further stabilize the potential holding function at the drains of the turned-off transistors. In this case, the auxiliary capacitance portions and the photo-carrier sink can share the same space. The pattern area thus can be economized, so that the matrix device elements can be further microminiaturized.

Further, when the matrix section and the drive circuit section are formed on the same substrate, since the connection wires can be eliminated, it is possible to obtain the following various advantages: the manufacturing process can be simplified; the device reliability can be improved; the operating voltage of the drive circuit section can be decreased; and thereby the load of external circuit can be reduced.

Further, the semiconductor regions for preventing harmful influence of incident light, of the same first conductivity type as that of the substrate can be formed automatically when the second conductivity transistor regions are formed; and the auxiliary capacitance portions can be formed simultaneously when the gates of the transistors are formed. It is thus unnecessary to add any new additional process to the ordinary MOS transistor manufacturing process; as a result, the manufacturing yield can be improved and thereby the device cost can be reduced.

Further, when the electrode (11) is driven in inversion driving method, since the semiconductor region can be driven in phase with the electrode, it is possible to reduce change in liquid crystal field, so that the liquid crystal can be operated under excellent conditions and the power can be economized.

What is claimed is:

1. An active matrix device comprising:

a plurality of switching transistors arranged into a matrix pattern on a semiconductor substrate of a first conductivity type;

signal lines for supplying data to sources of the transistors;

gate lines for controlling turn on and turn off operation of the transistors;

pixel electrodes connected to drains of the transistors; and semiconductor regions of a second conductivity type opposite to the first conductivity type, formed into wells in the semiconductor substrate so that the semiconductor regions are separated from each other by portions of the semiconductor substrate, the transistors being formed in the semiconductor regions, the semiconductor substrate and the semiconductor regions being reversed-biased with respect to each other.

2. The device of claim 1, further comprising an auxiliary capacitance electrode formed at least on each portion of the semiconductor substrate, via an insulating film, the auxiliary capacitance electrode being electrically connected to each pixel electrode and forming capacitance between the auxiliary electrode and the semiconductor substrate.

3. The device of claim 1, further comprising a drive circuit for driving the active matrix device, formed on the semiconductor substrate, the drive circuit being formed in a part of the semiconductor regions, the part of the semiconductor regions being electrically isolated from the semiconductor regions in which the transistors are formed.

4. The device of claim 3, further comprising a level shift circuit for converting signal levels of the driving circuit to signal levels of the transistors, the level shift circuit being formed between the drive circuit section and the transistors.

5. The device of claim 1, further comprising:

an electro-optical section connected to the pixel electrodes; and an auxiliary electrode connected to the electro-optical section, for applying electric fields to the electro-optical section, wherein the semiconductor substrate is biased at potential that varies periodically and is reverse-biased with respect to the semiconductor regions, and phase of the varying potential period is in phase with the auxiliary electrode.

* * * * *